United States Patent
Beall

(10) Patent No.: US 9,949,407 B1
(45) Date of Patent: Apr. 17, 2018

(54) COMPUTER SYSTEM WITH PARTIAL BYPASS COOLING

(71) Applicant: Amazon Technologies, Inc., Seattle, WA (US)

(72) Inventor: Christopher Strickland Beall, Woodinville, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/726,060

(22) Filed: May 29, 2015

(51) Int. Cl.
*H05K 7/20* (2006.01)
*H05K 7/14* (2006.01)

(52) U.S. Cl.
CPC ....... *H05K 7/20736* (2013.01); *H05K 7/1491* (2013.01)

(58) Field of Classification Search
CPC .................... H05K 7/20736; H05K 7/1491
See application file for complete search history.

(56) References Cited

U.S. PATENT DOCUMENTS

| | | | | |
|---|---|---|---|---|
| 5,424,915 A | * | 6/1995 | Katooka | H05K 7/20909 361/695 |
| 5,504,657 A | * | 4/1996 | Bellino | H05K 7/1461 174/351 |
| 5,515,515 A | * | 5/1996 | Kennedy | G06F 13/4081 361/679.02 |
| 5,943,219 A | * | 8/1999 | Bellino | H05K 9/0015 174/368 |
| 5,949,646 A | * | 9/1999 | Lee | H05K 7/2019 165/104.33 |
| 6,449,150 B1 | * | 9/2002 | Boone | H05K 7/20563 165/104.33 |
| 6,538,881 B1 | * | 3/2003 | Jeakins | H05K 7/20572 165/122 |
| 6,816,368 B2 | * | 11/2004 | Yokosawa | G11B 33/126 361/679.33 |
| 6,819,560 B2 | * | 11/2004 | Konshak | G06F 1/184 361/679.5 |
| 6,909,611 B2 | * | 6/2005 | Smith | G06F 1/181 307/43 |

(Continued)

OTHER PUBLICATIONS

U.S. Appl. No. 14/301,274, filed Jun. 10, 2014, Christopher Strickland Beall, et al.

(Continued)

*Primary Examiner* — David M Sinclair
*Assistant Examiner* — Theron S Milliser
(74) *Attorney, Agent, or Firm* — Robert C. Kowert; Meyertons, Hood, Kivlin, Kowert & Goetzel, P.C.

(57) ABSTRACT

A rack-mountable computer system includes a horizontal divider that divides a chassis interior of the computer system into a first level and a second level. One or more heat-producing components are mounted on the first level and a plurality of heat-producing components are mounted on the second level. The horizontal divider includes one or more openings that allow air flowing in the first level to mix with air flowing in the second level. Combined air including the air flowing in the second level and at least a portion of the air flowing in the first level cool a portion of the plurality of heat-producing components mounted in the second level downstream from the one or more openings in the horizontal divider.

20 Claims, 8 Drawing Sheets

(56) References Cited

U.S. PATENT DOCUMENTS

| | | | | |
|---|---|---|---|---|
| 6,980,435 | B2* | 12/2005 | Shum | H05K 7/20581 165/80.3 |
| 7,016,193 | B1* | 3/2006 | Jacques | H05K 7/20563 165/104.33 |
| 7,139,170 | B2* | 11/2006 | Chikusa | G06F 1/20 165/122 |
| 7,218,517 | B2* | 5/2007 | Wolford | H05K 1/0272 165/80.2 |
| 7,403,385 | B2* | 7/2008 | Boone | H05K 7/20727 361/692 |
| 7,495,906 | B2* | 2/2009 | Fujie | G11B 33/12 361/679.33 |
| 7,593,225 | B2* | 9/2009 | Sasagawa | G06F 1/187 165/104.33 |
| 7,813,121 | B2* | 10/2010 | Bisson | H05K 7/20563 361/679.5 |
| 8,191,841 | B2* | 6/2012 | Jeffery | G11B 33/02 165/104.13 |
| 8,238,104 | B2* | 8/2012 | Salpeter | H05K 7/1488 165/104.33 |
| 8,451,600 | B1* | 5/2013 | Ross | H05K 7/20736 165/80.3 |
| 8,472,181 | B2* | 6/2013 | Doll | G06F 1/20 361/679.49 |
| 8,472,183 | B1* | 6/2013 | Ross | H05K 7/20736 361/679.48 |
| 8,477,491 | B1* | 7/2013 | Ross | H05K 7/20736 361/679.48 |
| 8,743,549 | B2 | 6/2014 | Frink et al. | |
| 9,198,310 | B2* | 11/2015 | Eichelberg | H05K 5/0213 |
| 9,231,358 | B1* | 1/2016 | Schow | H01R 13/518 |
| 9,363,926 | B1* | 6/2016 | Beall | H05K 7/20736 |
| 9,466,964 | B1* | 10/2016 | Watson | H05K 7/1487 |
| 2004/0130861 | A1* | 7/2004 | Beall | H05K 7/1454 361/679.02 |
| 2004/0218359 | A1* | 11/2004 | Malone | H05K 7/20718 361/695 |
| 2006/0120038 | A1* | 6/2006 | Lucero | G06F 1/20 361/694 |
| 2007/0035923 | A1* | 2/2007 | Beall | G06F 1/20 361/679.48 |
| 2007/0064383 | A1* | 3/2007 | Tanaka | G06F 1/181 361/679.33 |
| 2007/0091559 | A1* | 4/2007 | Malone | G06F 1/187 361/679.32 |
| 2007/0127207 | A1* | 6/2007 | Katakura | G11B 33/12 361/694 |
| 2007/0211430 | A1* | 9/2007 | Bechtolsheim | H05K 7/20736 361/695 |
| 2008/0192431 | A1* | 8/2008 | Bechtolsheim | H05K 7/20727 361/695 |
| 2012/0069514 | A1* | 3/2012 | Ross | H05K 7/20736 361/679.33 |
| 2012/0243170 | A1* | 9/2012 | Frink | G06F 1/187 361/679.34 |

OTHER PUBLICATIONS

U.S. Appl. No. 14/217,149, filed Mar. 17, 2014, David Edward Bryan, et al.

U.S. Appl. No. 14/301,271, filed Jun. 10, 2014, David Edward Bryan, et al.

U.S. Appl. No. 14/460,075, filed Aug. 14, 2014, Christopher Strickland Beall, et al.

* cited by examiner

COMPUTER SYSTEM WITH PARTIAL BYPASS COOLING

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Some computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some computer systems, which may function as servers, include a number of components that are mounted in an interior of the computer systems. The components, which can include printed circuit boards (for example, a motherboard) and mass storage devices, can support one or more components that generate waste heat, referred to herein as "heat-producing components." For example, a motherboard can support a central processing unit, and mass storage devices can include hard disk drives which include motors and electronic components that generate heat. Mass storage devices can also include solid state drives that generate heat. Some or all of this heat must be removed from the components to maintain continuous operation of a computer system. The amount of heat generated by the central processing units, hard disk drives, etc. within a data room may be substantial. Heat may be removed from the heat-producing components via an airflow flowing through a computer system.

In some cases, cooling systems, including air moving systems, may be used to induce airflow through one or more portions of a data center, including airflow through a rack-mounted server that includes various heat-producing components. However, some servers direct airflow through an interior that includes multiple heat-producing components. Air removes heat from the heat-producing components and in turn the air is heated as it passes through the interiors that include the various heat-producing components, so that air passing over heat-producing components in a downstream portion of the server has a higher temperature than air passing over heat-producing components in an upstream portion of the server. Higher temperatures of the air in the downstream portion of the server may result in reduced heat removal capacity relative to air passing over heat-producing components in the upstream portion of the server. As a result, less heat may be removed from downstream heat-producing components than upstream heat-producing components. In some cases, the downstream heat-producing components are more sensitive to heat than the upstream heat-producing components, which can result in a suboptimal configuration.

In some cases, a computer system mounted in a rack includes one or more hot-pluggable electronic components, which can be added, removed, swapped, etc. from a computer system without powering down the computer system. Hot-pluggable electronic components in a computer system are often mounted at an external side of the computer system, including a "front" side through which cooling air is received into the computer system, to enable simplified access to the components for removal, addition, swapping, etc. In addition, mounting hot-pluggable electronic components to an external side of the computer system enables hot swapping without moving the computer system itself. Mounting hot-pluggable electronic components throughout the depth of the computer system interior can hamper hot-swapping efforts while maintaining operations by other hot-pluggable electronic components. Furthermore, as indicated above, mounting hot-pluggable electronic components throughout the depth of the interior can result in preheating of cooling air which removes heat from some components which are downstream of other components, which can reduce cooling efficiency and can negatively affect component performance.

Figure 1:
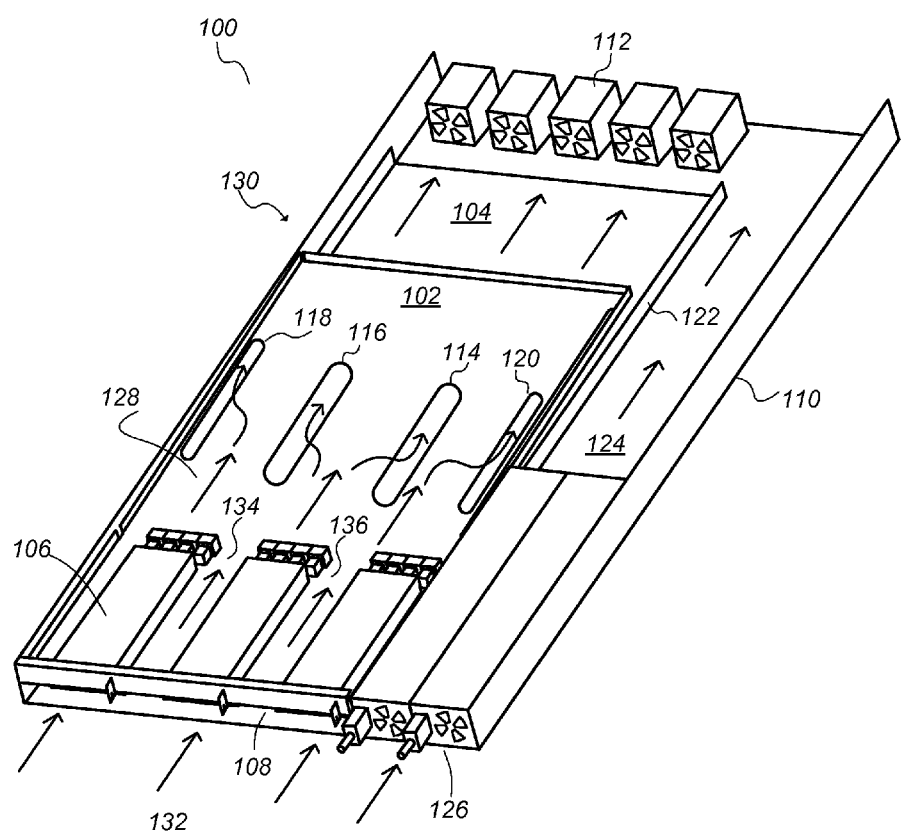
FIG. 1 is a perspective view of a computer system with partial bypass cooling, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations and removing waste heat from various heat-producing components in computer systems, are disclosed. According to one embodiment, a system includes a rack and storage systems mounted in the rack wherein at least one of the storage systems includes a chassis that includes an intake end and exhaust end. Cooling air is received into a chassis interior at the intake end and exhausted from the chassis interior at the exhaust end. The system includes a horizontal divider that at least partially divides the chassis interior into a first level and a second level. The first level includes at least one air plenum that extends from the intake end through at least a portion of the chassis interior. The second level includes at least one air plenum that extends from the intake end through at least a portion the chassis interior. One or more storage device controllers, such as peripheral component interconnect express cards or PCIe cards, are mounted on the first level of the chassis interior in an upstream portion of the chassis interior near the intake end of the chassis. The at least one air plenum of the first level is configured to direct a first level air flow received from the intake end of the chassis to cool the one or more storage device controllers mounted on the first level. Multiple storage devices, such as hard disk drives, solid state drives, etc., are mounted on the second level of the chassis interior. The at least one air plenum of the second level is configured to direct second level air flow received from the intake end of the chassis to cool the multiple storage devices mounted in the second level. The horizontal divider includes one or more openings that are configured to mix air flowing in the at least one air plenum of the first level with air flowing in the at least one air plenum of the second level at a location downstream from the one or more controllers mounted on the first level of the chassis and upstream from at least a portion of the multiple storage devices mounted on the second level of the chassis, wherein at least a portion of the first level air flow combines with the second level air flow to cool the at least a portion of the multiple storage devices mounted on the second level downstream from the one or more openings.

According to one embodiment, an apparatus includes a chassis comprising an intake end and an exhaust end. Cooling air is received into a chassis interior at the intake end and is exhausted from the chassis interior at the exhaust end. A horizontal divider divides the chassis into two levels, wherein a given level (for example, an upper level) comprises at least one air plenum that extends from the intake end through at least a portion of the chassis interior. Another level of the chassis (for example, a lower level) includes at least one air plenum that extends from the intake end through at least a portion of the chassis interior. One or more heat-producing components are mounted on the given level of the chassis interior and the air plenum of the given level is configured to direct an air flow of the given level, received from the intake end of the chassis, to cool the one or more heat-producing components in the given level. Multiple heat-producing components are mounted on the other level of the chassis interior and an air plenum of the other level is configured to direct an air flow of the other level, received from the intake end of the chassis, to cool the multiple heat-producing components in the other level. The horizontal divider includes one or more openings configured to mix air flowing in the at least one air plenum of the given level with air flowing in the at least one air plenum of the other level at a location that is downstream from the one or more heat-producing components mounted on the given level of the chassis and upstream from at least a portion of the multiple heat-producing components mounted on the other level of the chassis.

According to one embodiment, a method includes providing a chassis comprising a horizontal divider that at least partially divides a chassis interior of the chassis into a given level and another level, wherein the chassis includes an intake end and an exhaust end, wherein the intake end is configured to receive cooling air into the chassis interior and the exhaust end is configured to exhaust air from the chassis interior. The method includes directing air received at the intake end of the chassis in an airflow of the given level in at least one air plenum of the given level to cool heat-producing components mounted on the given level near the intake end of the chassis. The method also includes directing air received at the intake end of the chassis in another air flow of another level of the chassis in at least one air plenum of the other level to cool multiple heat-producing components mounted on the other level. The method includes mixing air flowing in the given level air flow with air flowing in the other level air flow, via one or more openings in the horizontal divider downstream of the one or more heat-producing components mounted on the given level, wherein the mixed air flows through at least a portion of the other level air plenum to cool a portion of the multiple heat-producing components mounted in the other level downstream of the one or more openings.

As used herein, "air moving device" includes any device, element, system, or combination thereof that can move air. Examples of air moving devices include fans, blowers, and compressed air systems.

As used herein, "backplane" means a plate or board to which other electronic components, such as mass storage devices, circuit boards, can be mounted. In some embodiments, mass storage devices, which can include one or more hard disk drives or solid state drives, are plugged into a backplane in a generally horizontal orientation relative to the face of the backplane. In some embodiments, a backplane includes and one or more power buses that can transmit power to components on the backplane, and one or more data buses that can transmit data to and from components installed on the backplane.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination of both. For example, air may be directed downwardly within a chassis by creating a pressure differential between a top portion and a bottom portion of the chassis.

As used herein, a "rack" means a rack, container, frame, or other element or combination of elements that can contain or physically support one or more computer systems.

FIG. 1 illustrates a perspective view of a computer system with partial bypass cooling, according to some embodiments. A computer system with partial bypass cooling may include a horizontal divider that divides a chassis interior of a computer system into two levels. For example, computer system 100 includes horizontal divider 128 that divides chassis interior 130 into first level 102 and second level 104. A horizontal divider in a computer system with partial bypass cooling may include one or more openings downstream from one or more heat-producing components mounted on a first level of the computer system with partial bypass cooling and downstream from a portion of a plurality of heat-producing components mounted on a second level of the computer system with partial bypass cooling and upstream from another portion of the plurality of heat-producing components mounted on the second level of the computer system with partial bypass cooling. For example, horizontal divider 128 of computer system 100 includes openings 114, 116, 118, and 120 that are downstream from storage controllers 106 mounted on first level 102. Openings 114, 116, 118, and 120 are also downstream of a portion of a plurality of mass storage devices mounted on second level 104 (hidden under horizontal divider 128) and upstream from an additional portion of the plurality of mass storage devices mounted on second level 104 (also hidden by horizontal divider 128). One or more heat-producing components can include one or more hot-pluggable electronic components, including one or more hot-pluggable mass storage devices. Mass storage devices can include one or more hard disk drives (HDDs), solid state drives (SSDs), etc.

Air received at an intake end of a chassis of a computer system with partial bypass cooling may be distributed between a first level of the computer system with partial bypass cooling and a second level of the computer system with partial bypass cooling. Some of the air received at an intake end may flow through one or more air plenums in the first level of the computer system and some of the air received at the intake end may flow through one or more air plenums of the second level of the computer system. For example, air 132 received at air intake 108 may be distributed between first level 102 and second level 104. Air flowing in the first level 102 may flow through air plenums 134 and 136 between adjacent storage controllers 106. Air flowing in first level air plenums of a computer system with partial bypass cooling may cool one or more heat-producing components mounted in the first level, such as storage controllers 106. Air flowing through one or more air plenums of a second level of a computer system with partial bypass cooling may cool multiple heat-producing components mounted in the second level. Air flowing in one or more air plenums of a first level may combine with air flowing in one or more air plenums of a second level via one or more openings in a horizontal divider of a computer system with partial bypass cooling, such as openings 114, 116, 118, and 120. The combined or mixed air comprising at least a portion of the air from the first level air plenums and the air flowing in the second level air plenums may cool a portion of the heat-producing components mounted in the second level that are mounted downstream of the one or more openings in the horizontal divider.

Air flowing in one or more air plenums of a first level may have cooled one or more heat-producing components mounted in the first level prior to reaching one or more openings in a horizontal divider of a computer system with partial bypass cooling. Air flowing in a first level arriving at one or more openings in a horizontal divider may have passed through and therefore cooled fewer heat-producing components than corresponding air flowing in one or more air plenums of a second level when arriving at the one or more openings in the horizontal divider. Therefore, air in a first level of a computer system with partial bypass cooling may have less pre-heat than corresponding air in a second level of a computer system with partial bypass cooling at a particular location along the depth of a chassis interior, such as at the location of openings 114, 116, 118, and 120. In some embodiments, heat-producing components mounted in a first level may produce less heat than heat-producing components mounted in a second level. Air flowing in one or more air plenums of a first level may have absorbed less heat energy and therefore have a lower temperature than air flowing in one or more air plenums of a second level prior to arriving at a location of one or more openings in a horizontal divider. The cooler air flowing in the one or more air plenums of the first level may mix with the warmer air flowing in the one or more air plenums of the second level. The combined air, including the air flowing in the one or more second level air plenums and at least a portion of the air flowing in the one or more air plenums of the first level, may have a temperature that is less than a temperature of the air flowing in the one or more air plenums of the second level prior to arriving at the one or more openings in the horizontal divider.

A combined air flow including at least a portion of air from a first level and air flowing in one or more air plenums of a second level may also have a combined volumetric flow rate that is greater than a volumetric flow rate of air flowing in the one or more air plenums of the second level upstream of one or more openings in a horizontal divider. The combined air flow with a lower temperature and greater volumetric flow rate may cool additional heat-producing components mounted in a second level of a computer system with partial bypass cooling downstream of the one or more openings in the horizontal divider. The combined air flow may remove more heat from the one or more heat-producing components downstream of the one or more openings in the horizontal divider than air in a computer system without partial bypass cooling that uses air pre-heated by heat-producing components mounted in an upstream portion of the second level to cool heat-producing components mounted in a downstream portion of the second level.

For example in FIG. 1, a portion of air 132 received at air intake 108 flows through air intake 108 into first level 102 and second level 104. The air flowing in the first level 102 may cool controllers 106 mounted in first level 102. The air flowing in the second level 104 may cool a portion of a plurality of mass storage devices mounted on second level 104 prior to arriving at the openings 114, 116, 118, and 120 in horizontal divider 128. A portion of the air flowing in the first level 102 may flow through openings 114, 116, 118, and 120 to combine with the air flowing in second level 104. The combined air may then cool additional mass storage devices mounted in second level 104 downstream from openings 114, 116, 118, and 120.

A computer system with partial bypass cooling may include one or more air movers, such as fans 112 that induce air flow through a chassis interior of the computer system with partial bypass cooling. Air may be drawn into a computer system with partial bypass cooling via one or more openings at an intake end of a chassis, such as openings 108 of chassis 110. The openings at an intake end of a chassis may distribute air received at the intake end between two levels created by a horizontal divider. In some embodiments, air openings, such as air openings 108, may be adjustable to adjust a distribution of air between a first level and a second level of a computer system with partial bypass cooling.

In some embodiments, a computer system with partial bypass cooling may include hot pluggable heat-producing components. Hot-pluggable heat-producing elements may be mounted on a tray that is configured to be at least partially removed from a chassis of a computer system with partial bypass cooling. Changes made to hot-pluggable heat-producing components mounted on one of the two levels of a computer system with partial bypass cooling such as, replacing a hot-pluggable heat-producing component with a replacement hot-pluggable heat-producing component may alter air flow characteristics or may require more or less heat energy to be removed from the replacement hot-pluggable heat-producing component than the heat-producing component that is being replaced. Adjustable openings at an intake end of a computer system with partial bypass cooling, may be adjusted to re-balance a distribution of air between a first level and a second level of a computer system with partial bypass cooling in response to such changes.

In some embodiments, a computer system with partial bypass cooling may include one or more power supply units mounted in a separate portion of a chassis of a computer system with partial bypass cooling. For example, chassis 110 of computer system 100 includes separate portion 124 that includes power supplies 126. Embodiments that include one or more power supply units may include a divider that at least partially isolates a separate portion containing power supply units from air flowing in a first and a second level of a chassis interior formed by a horizontal divider. For example, computer system 100 includes barrier 122 that at least partially isolates separate portion 124 from air flowing in first level 102 and air flowing in second level 104. At least partially isolating a separate portion including power supply units from air flowing in a first and second level formed by a horizontal divider may prevent heat removed from power supply units from heating air used to cool heat-producing components mounted in the first level or second level of the computer system with partial bypass cooling. Also, partially isolating air cooling power supply units from air flowing in a first and second level of the chassis interior may reduce variability in the air flowing in the first and second level of the chassis interior. For example, variations in air temperature or flow through the separate portion comprising the one or more power supply units may not affect air temperatures or flows in the first level or second level of the chassis interior.

In some embodiments, power supply units may operate at higher temperatures than heat-producing components mounted in a first level and second level of a computer system with partial bypass cooling, so that air temperatures in a separate portion comprising power supply units may be greater than air temperatures in a first and second level of a computer system with partial bypass cooling.

Figure 2A:
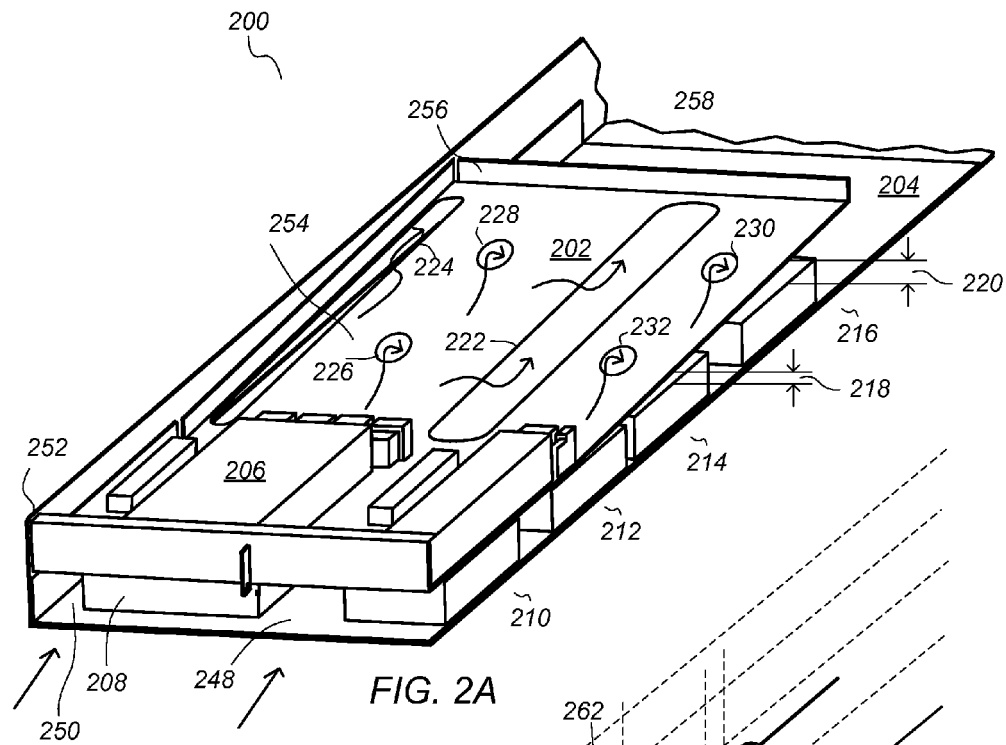
FIG. 2A is a perspective view of a cut-away of a computer system with partial bypass cooling, according to some embodiments.

FIG. 2A is a perspective view of a cutaway of a computer system with partial bypass cooling, according to some embodiments. Computer system 200 illustrated in FIG. 2A may be a computer system 100 illustrated in FIG. 1. The cutaway view in FIG. 2A illustrates at least some of the plurality of mass storage devices mounted on the second level that were hidden below the horizontal divider in FIG. 1. For example, computer system 200 includes mass storage devices 208, 210, 212, 214, and 216. As shown in the embodiment illustrated in FIG. 2A, heat-producing components may be mounted throughout the depth of a second level of a chassis interior from the inlet end to the exhaust end, such as mass storage devices 208, 210, 212, 214, and 216 mounted on second level 204 of chassis 252. A heat-producing component may be referred to as an "upstream heat-producing component" or "downstream heat-producing component" based at least in part upon the heat-producing component being coupled to the chassis at a position which is downstream of another set of heat-producing components with respect to an air flow through the interior. As a result, an air flow which removes heat from one or more downstream heat-producing components, having previously passed in heat transfer communication with one or more upstream heat-producing components, may have been pre-heated by the upstream heat-producing components prior to passing in heat-transfer communication with the downstream heat-producing components.

Heat-producing components mounted on a second level of a computer system with partial bypass cooling may be mounted in columns. Space between adjacent columns of heat-producing components may form one or more air plenums, for example the space between mass storage device 208 and mass storage device 210 forms air plenum 248. Also, a space between a heat-producing component and a portion of a chassis of a computer system with partial bypass storage, such as the space between mass storage device 208 and chassis 252 may form an air plenum, such as air plenum 250.

In some embodiments, air flowing in a first level of a computer system with partial bypass cooling may bypass one or more heat-producing components mounted in a second level of a computer system with partial bypass cooling before at least partially combining with air flowing in the second level of the computer system with partial bypass cooling. For example, air flowing in first level 202 bypasses mass storage device 210 before at least partially combining with air flowing in second level 204 via openings 222 and 224. FIG. 2A illustrates openings 222 and 224 being located downstream of a single row of mass storage devices that includes mass storage device 210. In some embodiments, openings 222 and 224 may be located further upstream or further downstream in a computer system with partial bypass cooling so that more or less rows of heat-producing components mounted on a second level of a computer system with partial bypass cooling are bypassed by air flowing in the first level.

In some embodiments, a computer system with partial bypass cooling may include one or more additional openings in addition to the one or more openings described above. The one or more additional openings may be located in a horizontal divider above respective mass storage devices mounted on a second level of a computer system with partial bypass cooling, such that air flowing from the first level to the second level through the one or more additional openings cools respective heat-producing components mounted on the second level below the one or more additional openings. For example, openings 226, 228, 230, and 232 may be located above respective mass storage devices mounted on second level 204. FIG. 2A illustrates additional opening 232 located above mass storage device 214 and additional opening 230 located above mass storage device 216. Mass storage devices 214 and 216 may be cooled by air flowing through additional openings 230 and 232.

In some embodiments, a computer system with partial bypass cooling may include a horizontal divider that changes elevation in a direction of airflow in the chassis interior downstream from one or more heat-producing components mounted on a first level of the computer system with partial bypass cooling. For example, horizontal divider 254 of computer system 200 is mounted in chassis 252 at an angle downstream of storage controllers 206. A horizontal divider that changes elevation in a direction of airflow in a chassis interior may cause a cross-sectional area of a first level in the chassis interior to decrease and a cross-sectional area of a second level of the chassis interior to increase in the direction of air flow. For example, in FIG. 2A, a height above mass storage device 214 is illustrated by dimension 218 and a height above mass storage device 216 is illustrated by dimension 220. As can be seen horizontal divider 254 is mounted at an angle downstream of storage controllers 206 such that in the direction of airflow towards the rear of chassis 252 the cross-sectional area of first level 202 decreases as the cross-sectional area of second level 204 increases. Reducing the cross-sectional area of first level 202 may inhibit continued air flow in first level 202 for air flowing in first level 202 and therefore cause air flowing in first level 202 to flow into openings 222 and 224, and additional openings 226, 228, 230, and 232. As can be seen in FIG. 2A, dimension 220 is greater than dimension 218 indicating more space between mass storage device 216 and horizontal divider 254 than the space between mass storage device 214 and horizontal divider 254. FIG. 2A illustrates a horizontal divider that slopes upward to reduce a cross-sectional area of a first level of a computer system with partial bypass cooling and to increase a cross-sectional area of a second level of a computer system with partial bypass cooling. In some embodiments, a horizontal divider may reduce a first level cross-section area and increase a second level cross-sectional area by curving upward, changing heights in a stair-stepped pattern, or other equivalent designs that reduce the cross-sectional area of a first level while increasing a cross-sectional area of a second level.

In some embodiments, a computer system with partial bypass cooling may include a vertical barrier at an end of a horizontal divider, such as vertical barrier 256. A vertical barrier may inhibit air flowing in a first level of a computer system with partial bypass cooling, such as first level 202 of computer system 200, from flowing out of a first level of the computer system without passing through one or more openings in a horizontal divider of the computer system with partial bypass cooling and into a second level of the computer system with partial bypass cooling. For example, vertical barrier 256 may function as a barrier that prevents air from flowing out of a back end of first level 202 towards exhaust 258 and instead causes air flowing in first level 202 to flow into second level 204 via openings 222 and 224 and additional openings 226, 228, 230, and 232. Air flowing in the second level may then flow out of chassis 252 towards exhaust 258.

Figure 2B:
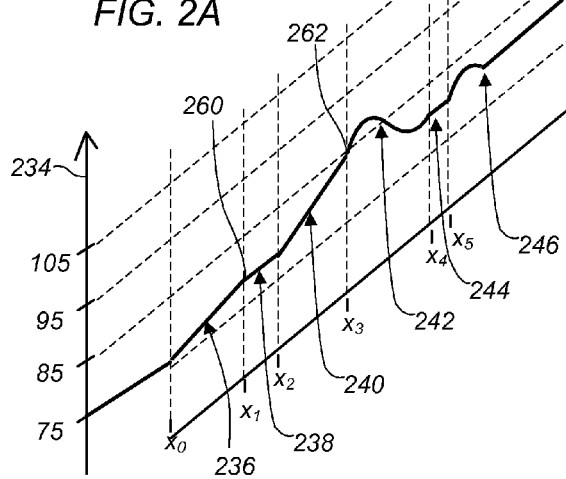
FIG. 2B is a temperature graph indicating effects of partial bypass cooling on air flowing through a computer system with partial bypass cooling, according to some embodiments.

FIG. 2B illustrates a temperature graph indicating effects of partial bypass cooling on air flowing through a computer system with partial bypass cooling, according to some embodiments. FIG. 2B shows how air flowing in a second level of a computer system with partial bypass cooling is heated by heat-producing components mounted in the second level of a computer system with partial bypass cooling and is combined with cooler air from a first level of the computer system with partial bypass cooling. Locations 236, 238, 240, 242, 244, and 246 represent corresponding locations in second level 204 of computer system 200. Temperatures 234 indicate example air temperatures in these locations. The temperatures illustrated in FIG. 2B are for example purposes only and are intended to show relative relationships. A computer system with partial bypass cooling may operate at higher or lower temperatures. Also an amount of temperature change in air flowing in a second level of a computer system with partial bypass cooling due to mixing with air from a first level of a computer system with partial bypass cooling may be more or less than what is illustrated in FIG. 2B in some embodiments.

At 236 air entering chassis 252 in second level 204 passes over mass storage devices in a first column including mass storage device 210. The air is heated to temperature 260. At 238 the air flowing in the second level 204 then passes between a first column of mass storage devices and a second column of mass storage devices. At 240 the air flowing in the second level 204 then passes over storage devices in a second column including mass storage device 212. The air flowing in the second level 204 is further heated to temperature 262. While passing over the second column of mass storage devices including mass storage device 212, air flowing in first level 202 combines with the air flowing in second level 204 via openings 222 and 224. The air flowing in first level 202 may be cooler than the air flowing in second level 204 because the air flowing in first level 202 may have passed over fewer heat-producing components such as storage controllers 206 or may be cooler because the heat-producing components mounted in the first level, such as storage controllers 206 reject less waste heat than heat-producing components mounted in the second level, such as mass storage devices 208, 210, 212, 214, and 216. Air flowing in the first level 202 may also combine with the air flowing in the second level via one or more additional openings located above respective mass storage devices. At 242 air flowing in the first level combines with air flowing in the second level via openings 222 and 224 and additional openings 226 and 232. As can be seen in FIG. 2B at 242, the air flowing in the second level at 242 is initially further heated by mass storage device 214 but then the air temperature of the air flowing in the second level at 242 is then reduced by cooler air from first level 202 combining with the air flowing in the second level 204 at 242. At 244 the air flowing through the second level then passes between the third column of mass storage devices that includes mass storage device 214 and the fourth column of mass storage devices that includes mass storage device 216. At 246 the air flowing in the second level 204 is combined with additional air from the first level 202. At 246 the air flowing in second level 204 is partially heated by passing over mass storage device 216 and is also cooled by combining with cooler air from first level 202 via additional opening 230.

As can be seen in FIG. 2B, a computer system with partial bypass cooling allows cooler air from a first level of a computer system with partial bypass cooling to combine with pre-heated air that has passed over one or more heat-producing components in a second level of the computer system, such that the cooler air of the first level combining with the pre-heated air of the second level reduces the overall temperature of the air flowing in the second level. The air flowing in the second level with the reduced temperature can then cools additional heat-producing components mounted in the second level. Because the air flowing in the second level has a lower temperature than it would have without partial bypass cooling, the air flowing in the second level can remove more heat from downstream heat-producing components than a system without partial bypass cooling.

Figure 3:
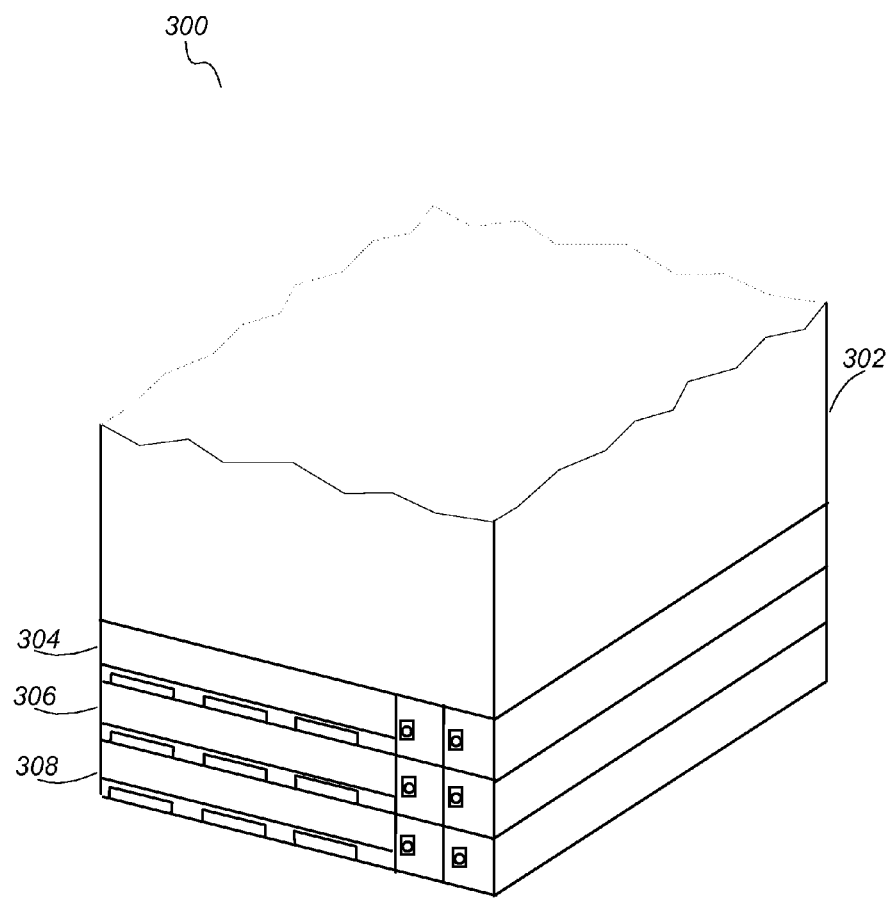
FIG. 3 illustrates a computer system with partial bypass cooling mounted in a rack, according to some embodiments.

FIG. 3 illustrates a computer system with partial bypass cooling mounted in a rack, according to some embodiments. Any of the computer systems described in regards to FIGS. 1-8 may be mounted in a rack. A rack may be part of a datacenter comprising multiple computer systems with partial bypass cooling. For example, multiple computer systems with partial bypass cooling in a data center may include multiple data storage servers used to implement a data storage system. In some embodiments, multiple computer systems with partial bypass cooling may be used to implement a computing service. In some embodiments one or more computer system with partial bypass cooling may be used for other purposes. In FIG. 3 rack system 300 includes rack 302 and computer systems with partial bypass cooling 304, 306, and 308. Computer systems 304, 306, and 308 may be any of computer systems with partial bypass cooling described in FIGS. 1-8, such as computer systems 100 and 200 described in FIGS. 1 and 2.

Figure 4:
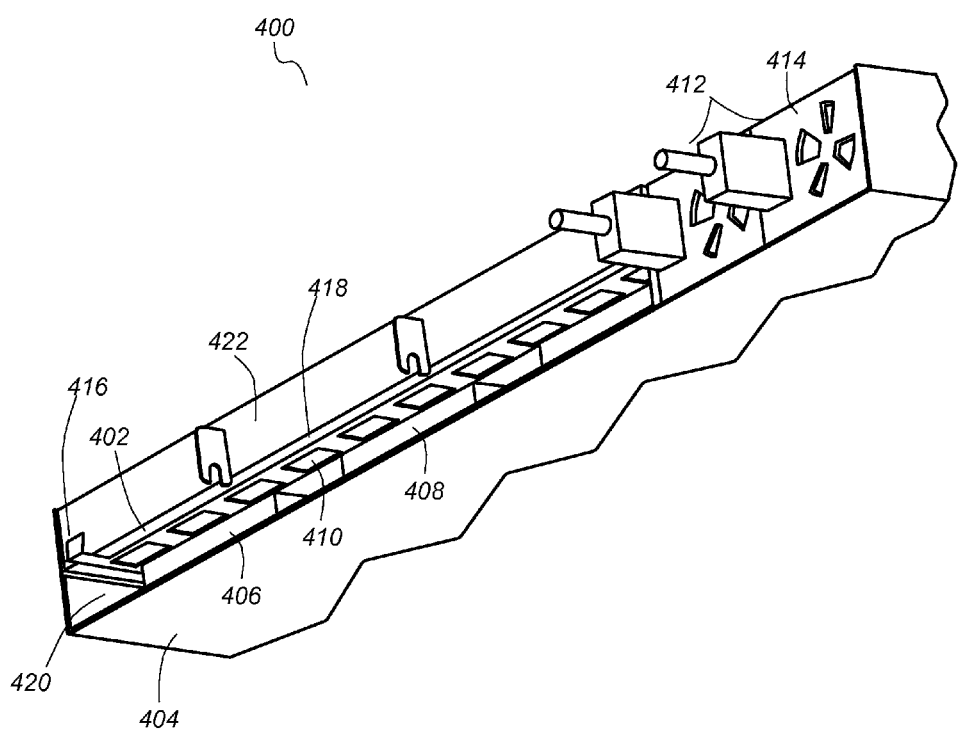
FIG. 4 illustrates an air inlet to a computer system with partial bypass cooling, according to some embodiments.

FIG. 4 illustrates an air inlet to a computer system with partial bypass cooling, according to some embodiments. A computer system with partial bypass cooling may include one or more openings in an air intake end of a chassis of the computer system with partial bypass cooling that allow air to be received into the interior of the chassis of the computer system with partial bypass cooling. For example, computer system 400 includes openings 410 that allow air to be drawn into chassis 404. Note that computer system 400 in FIG. 4 illustrates an example arrangement of openings that allow air to be received into a computer system with partial bypass cooling. Those skilled in the art will appreciate that various other configurations of openings may be used to allow air to be received into a chassis interior of a computer system with partial bypass cooling.

A computer system with partial bypass cooling may include one or more fans mounted at an exhaust end of a chassis of the computer system with partial bypass cooling. The fans mounted at the exhaust end of the chassis may create a pressure differential within a chassis interior of the computer system with partial bypass cooling that causes air to be drawn into the chassis interior at the intake end.

A horizontal divider may divide the chassis interior into a first level and a second level. In some embodiments, the second level may be open at the intake end so that air can be received into the chassis interior and pass over heat-producing components mounted in the second level. The first level may be closed at the intake end and there may be one or more openings that allow air to be received into the first level of the chassis interior from the intake end. For example, chassis 404 is open at the intake end at second level 420 and is closed at the intake end at first level 422. Air entering chassis 404 on second level 420 flows over heat-producing components 406 and 408. Air entering chassis 404 also flows into openings 410 at the intake end that allow air to be received into first level 422. In some embodiments, openings at an intake end may be adjustable to adjust a distribution of air drawn into a first level of a computer system with partial bypass cooling and a second level of a computer system with partial bypass cooling. For example, openings 410 are adjustable. Plate 418 is connected to adjustment lever 416. By pressing on adjustment lever 416 plate 418 can be moved back and forth along horizontal divider 402 causing openings 410 to become larger or smaller based on the direction in which plate 418 is slid along horizontal divider 402.

Adjusting the distribution of air received into a first level and second level of a computer system with partial bypass cooling may allow the amount of air that bypasses heat-producing components mounted in a second level of a computer system with partial bypass cooling to be adjusted. It may be desirable to adjust the amount of air bypassing heat-producing components mounted in a second level for a variety of reasons. For example, a replacement hot-pluggable component installed in a second level of a computer system with bypass cooling may have different heat dissipation requirements or alter air flow characteristics in the second level compared to a hot-pluggable component that the replacement component is replacing. As a result, a distribution of air between the first level and the second level of a computer system with partial bypass cooling may need to be adjusted due to differences in the replacement hot-pluggable component. In another example, changes in cooling air supply conditions, such as a change in temperature or humidity, may require the distribution of air between a first level and a second level of a computer system with partial bypass cooling to be adjusted. Other changes, such as installing different air moving devices, such as fans, in a computer system with partial bypass cooling may require adjusting a distribution of air between a first level and a second level of a computer system with partial bypass cooling.

Air may also be received into a separate portion of a chassis interior of a computer system with partial bypass cooling that includes power supply units. Air may be received into the separate portion of the chassis interior with power supply units via separate openings. For example air is received into separate portion 412 that comprises power supply units via separate openings 414.

Figure 5:
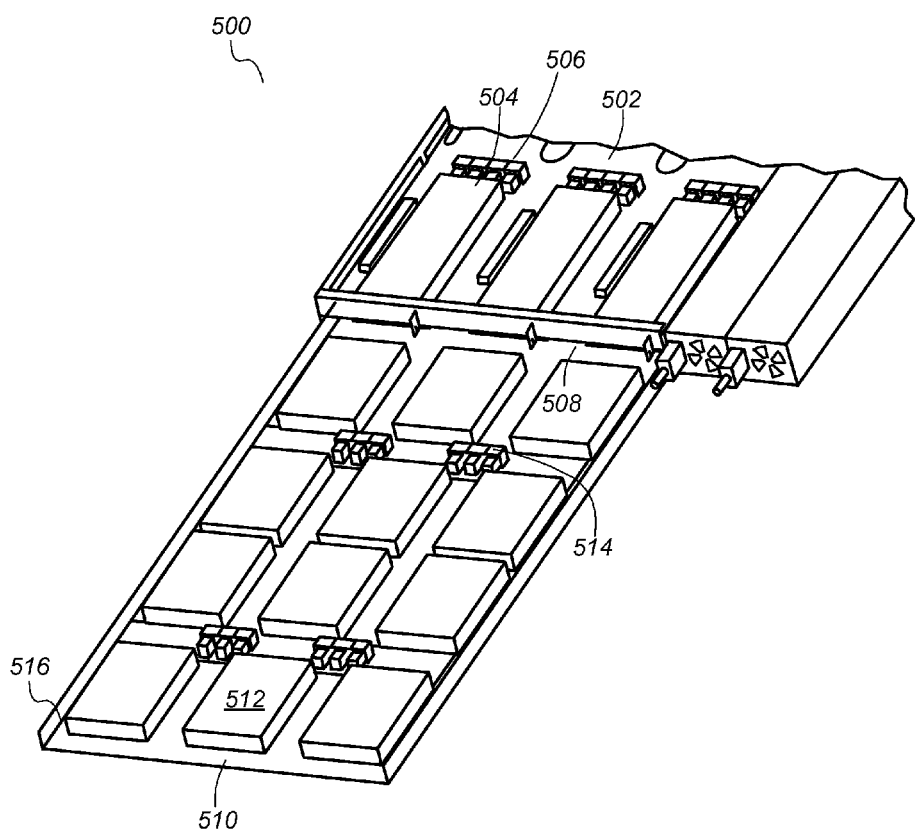
FIG. 5 illustrates a partially removable tray of a computer system with partial bypass cooling in an extended position, according to some embodiments.

FIG. 5 illustrates a partially removable tray of a computer system with partial bypass cooling in an extended position, according to some embodiments. A computer system with partial bypass cooling may include a moveable tray, such as tray 510 on second level 516 of computer system 500. Heat-producing components, such as mass storage devices 512, and backplane components, such as backplane connectors 514, may be mounted on a partially removable tray, such as tray 510. The heat-producing components mounted on a partially removable tray may be hot-pluggable components. A partially removable tray, such as tray 510, may be partially removed from a chassis, such as chassis 508, to allow access to hot-pluggable heat-producing components mounted on the tray, such as mass storage devices 512 mounted on tray

510. One or more cables (not shown) may connect heat-producing components mounted on a first level of a computer system with partial bypass cooling with heat-producing components mounted on a second level of a computer system with partial bypass cooling. For example, storage controllers 504 mounted on first level 502 of computer system 500 may be connected to mass storage devices 512 mounted on second level 516 of computer system 500, via connectors 506 connected to connectors 514 by one or more cables (not shown). In some embodiments, cables connecting heat-producing components of a first level of a computer system with partial bypass cooling to heat-producing components on a second level of a computer system with partial bypass cooing may pass through one or more openings in a horizontal divider of the computer system with partial bypass cooling, wherein the one or more openings in the horizontal divider are configured to mix air flowing in the first level with air flowing in the second level.

Figure 6:
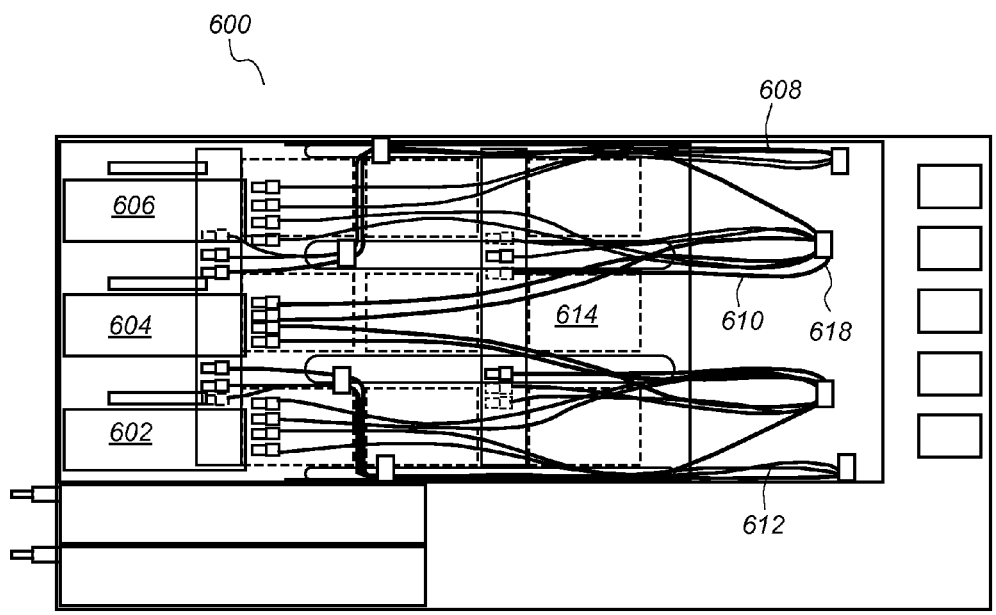
FIG. 6 is a top view of a computer system with partial bypass cooling that illustrates cables connecting components between levels of the computer system with partial bypass cooling, according to some embodiments.

FIG. 6 is a top view of a computer system with partial bypass cooling that illustrates cables connecting components between levels of the computer system with partial bypass cooling, according to some embodiments. As can be seen in FIG. 6 computer system 600 includes cables 608, 610, and 612 that connect storage device controllers 602, 604, and 606 to mass storage devices 614. One or more tie-down points may partially secure cables connecting heat-producing components such that the cables are confined to a limited space within the chassis interior of a computer system with partial bypass cooling. For example, tie down 618 secures cables 610. Securing cables, such as cables 610, may guide the cables through openings between levels of a computer system with partial bypass cooling such that the cables do not inhibit air flow through the openings. Also, tie down points, such as tie down point 618 may secure cables in a channel between columns of mass storage devices so that a partially removable tray, such as tray 510 described in FIG. 5, can be partially removed and returned to a chassis interior of a computer system with partial bypass cooling without cables, such as cables 610, becoming tangled or snagging on components within a chassis of a computer system with partial bypass cooling such as mass storage devices 614. In some embodiments, openings in a horizontal divider may be sized to allow cables to pass between a first level of a computer system with partial bypass cooling and a second level of the computer system while providing sufficient space for air flowing in the first level to mix with air flowing in the second level of the computer system with partial bypass cooling.

Figure 7:
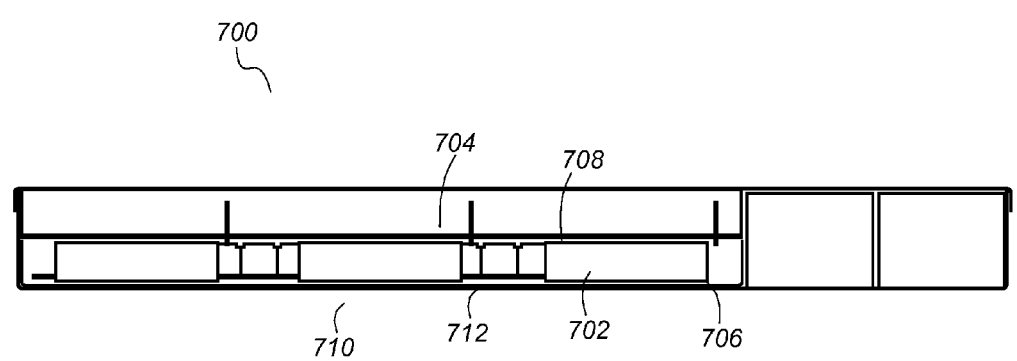
FIG. 7 is a front view of a computer system with partial bypass cooling, according to some embodiments.

FIG. 7 is a front view of a computer system with partial bypass cooling, according to some embodiments. A computer system with partial bypass cooling may include an air gap above and/or below heat-producing components mounted in the computer system with partial bypass cooling. The one or more air gaps may increase heat transfer with air passing over the components mounted in a computer system with partial bypass cooling. For example, computer system 700 includes mass storage devices 702 mounted on second level 710 of computer system 700. Mass storage device 702 is mounted on tray 712 of second level 710 such that there is a gap 706 between mass storage device 702 and tray 712. Computer system 700 is configured such that there is also a gap 708 between the top of mass storage device 702 and horizontal divider 704. In some embodiments, a gap between a mass storage device and a tray on which it is mounted may be approximately one millimeter. In some embodiments, a gap between the top of a mass storage device and a horizontal divider of a computer system with partial bypass cooling may be approximately 0.6 mm. In some embodiments mass storage devices with different dimensions may be used and there may be different gaps between a mass storage device and a tray it is mounted on or a different gap between a top of a mass storage device and a horizontal divider. In some embodiments, a computer system with partial bypass cooling may be configured to fit within a 1U slot of a standard 19" rack, e.g. a computer system with partial bypass cooling may have a height of approximately 1.75". In some embodiments, a computer system with partial bypass cooling may be used in other rack configurations including rack configurations other than standard 19" rack configurations.

Figure 8:
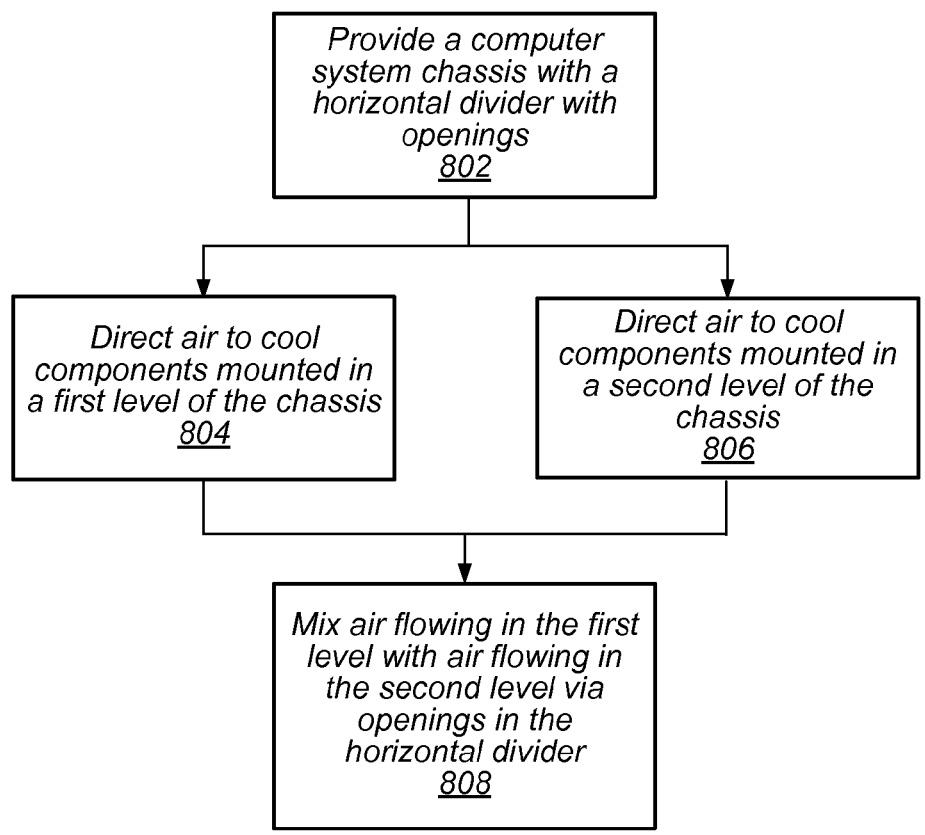
FIG. 8 illustrates a method of cooling components in a computer system with partial bypass cooling, according to some embodiments.

FIG. 8 illustrates a method of providing a computer system with partial bypass cooling, according to some embodiments. The illustrated method can be implemented with regard to one or more of the computer systems illustrated herein, including computer system 100 illustrated in FIG. 1 and computer system 200 illustrated in FIG. 2.

At 802, a computer system with partial bypass cooling is provided. The computer system with partial bypass cooling includes a horizontal divider that at least partially divides a chassis interior of the computer system into two levels, a given level and another level. The chassis of the computer system with partial bypass cooling comprises an intake end and an exhaust end. The chassis is configured to receive air into the chassis interior at the intake end and to exhaust air from the chassis interior at the exhaust end. In some embodiments, a computer system with partial bypass cooling may be mounted in a rack. And, a rack may be installed in a computer room of a data center. A computer system with partial bypass cooling may be used to provide storage services, compute services, or other services to clients of a data center.

At 804, air is directed in a first level of the chassis interior to cool heat-producing components mounted in the first level of the chassis interior. In some embodiments, an amount of air distributed to the first level of the chassis interior may be adjusted by adjusting one or more adjustable openings at the intake end of the chassis interior.

At 806, air is directed in a second level of the chassis interior to cool heat-producing components mounted in the second level of the chassis interior. In some embodiments air may be drawn into the second level of the chassis interior via a partially open face of the computer system with partial bypass cooling at the intake end of the chassis. In some embodiments, the heat-producing components mounted on the second level of the chassis may include a plurality of heat-producing components mounted in rows and columns. As shown in FIG. 8, 804 and 806 may be performed simultaneously so that air is directed in a first level of the chassis interior to cool heat-producing components mounted in the first level while air is being directed in a second level of the chassis interior to cool heat-producing components mounted in the second level.

At 808, air flowing in the first level is mixed with air flowing in the second level via one or more openings in the horizontal divider dividing the first level and the second level. In some embodiments the horizontal divider may include openings that are aligned with air plenums of the second level formed by gaps between rows of heat-producing components. In some embodiments, a horizontal divider may include additional openings above respective heat-producing components mounted on the second level. Air flowing in the first level may pass over fewer heat-producing components than air flowing in the second level such that at the location of the openings in the horizontal divider, the air flowing in the first level is at a lower temperature than the air flowing in the second level, even though the air drawn into the first level and the air drawn into the second level where from the same source of air at a similar temperature. The cooler air in the first level mixing and combining with the air flowing in the second level may lower the temperature of the resulting combined air flowing in the second level downstream of the one or more openings or additional openings. In some embodiments, the openings that allow air flowing in the first level to mix with air flowing in the second level may include one or more cables passing through the openings. The cables may connect heat-producing components mounted on the first level with heat-producing components mounted on the second level.

In some embodiments, the horizontal divider may be configured such that the cross-sectional area of the first level downstream of one or more heat-producing components mounted in the first level decreases in a direction of air flow as a cross-sectional area of the second level increases in the direction of air flow. The reduction in cross-sectional area of the first level may cause air flowing in the first level to flow through the one or more openings or additional openings in the horizontal divider and mix with air flowing in the second level. In some embodiments, the horizontal divider may include a vertical barrier at an end of the first level nearest the exhaust end of the chassis that prevents air flowing in the first level from flowing out the exhaust end of the first level and instead forces the air flowing in the first level to flow through the one or more openings in the horizontal divider into the second level.

In some embodiments, a computer system with partial bypass cooling may include a separate portion comprising one or more power supply units. Air may be directed into the separate portion from the intake end of the chassis independent of the air flowing through the first level and the second level of the chassis interior. The air flowing through the separate portion including the power supply units may be partially isolated from the air flowing in the first level and the second level of the chassis interior, such that heat rejected by the power supply units into the air flowing in the separate portion does not significantly heat the air flowing in the first level and the second level of the chassis interior.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
    a rack; and
    a plurality of storage systems mounted in the rack, at least one of the storage systems comprising:
        a chassis comprising an intake end and an exhaust end, wherein cooling air is received into a chassis interior at the intake end and exhausted from the chassis interior at the exhaust end;
        a horizontal divider extending from the intake end of the chassis through at least a portion of the chassis interior that at least partially divides the chassis interior into a first level and a second level, wherein the horizontal divider divides cooling air entering the chassis at the intake end into at least one air plenum on the first level that extends from the intake end through at least a portion of the chassis interior and at least one air plenum on the second level that extends from the intake end through at least a portion of the chassis interior;
        one or more storage device controllers mounted on the first level of the chassis interior in an upstream portion of the chassis interior proximate to the intake end of the chassis;
        a plurality of storage devices mounted on the second level of the chassis interior;
        a set of one or more openings prior to the one or more storage device controllers, wherein air entering the chassis flows into the first level via the set of openings, wherein the at least one air plenum of the first level is configured to direct a first level air flow received from the set of openings toward the one or more storage device controllers to cool the one or more storage device controllers; and
        another set of one or more openings prior to the plurality of storage devices, wherein air entering the chassis flows into the second level via the other set of openings, wherein the air plenum of the second level is configured to direct a second level air flow received from the other set of openings towards the plurality of storage devices to cool the plurality of storage devices;
    wherein, the horizontal divider comprises one or more openings configured to mix air flowing in the at least one air plenum of the first level with air flowing in the at least one air plenum of the second level at a location that is downstream from the one or more storage device controllers mounted on the first level of the chassis and upstream from at least a portion of the plurality of storage devices mounted on the second level of the chassis, wherein at least a portion of the first level air flow combines with the second level air flow to cool the at least a portion of the plurality of storage devices mounted on the second level downstream from the one or more openings.

2. The system of claim 1, wherein the horizontal divider is configured such that a cross-sectional area of the first level, perpendicular to a direction of the first level air flow, downstream from the one or more storage device controllers reduces in cross-sectional area in the direction of the first level air flow and a cross-sectional area of the second level, perpendicular to a direction of the second level air flow, downstream from one or more of the plurality of storage devices increases in cross-sectional area in the direction of the second level air flow.

3. The system of claim 1, further comprising one or more data cables configured to connect the one or more storage device controllers to the plurality of storage devices, wherein the one or more cables are routed through at least one of the one or more openings.

4. The system of claim 1, wherein the one or more openings in the horizontal divider are located in the horizontal divider downstream of one or more of the plurality of storage devices so that the first level air flow flowing in the at least one air plenum of the first level bypasses the one or more storage devices before mixing with the second level air flow flowing in the at least one air plenum of the second level and cooling the at least a portion of the plurality of storage devices downstream from the one or more openings.

5. An apparatus, comprising:
- a chassis comprising an intake end and an exhaust end, wherein cooling air is received into a chassis interior at the intake end and exhausted from the chassis interior at the exhaust end;
- a horizontal divider extending from the intake end of the chassis through at least a portion of the chassis interior that at least partially divides the chassis interior into two levels, wherein the horizontal divider divides cooling air entering the chassis at the intake end into at least one air plenum that extends from the intake end through at least a portion of the chassis interior on a given level of the chassis interior and at least one air plenum that extends from the intake end through at least a portion of the chassis interior on another level of the chassis interior;
- one or more heat-producing components mounted on the given level of the chassis interior in an upstream portion of the chassis interior;
- a plurality of heat-producing components mounted on the other level of the chassis interior;
- a set of one or more openings prior to the one or more heat producing components mounted on the given level, wherein air entering the chassis flows into the given level via the set of openings, wherein the at least one air plenum of the given level is configured to direct a given level air flow received from the set of openings toward the one or more heat producing components to cool the one or more heat producing components; and
- another set of one or more openings prior to the plurality of heat producing components mounted on the other level, wherein air entering the chassis flows into the other level via the other set of openings, wherein the air plenum of the other level is configured to direct an other level air flow received from the other set of openings towards the plurality of heat producing components to cool the plurality of heat producing components;
- wherein, the horizontal divider comprises one or more openings configured to mix air flowing in the at least one air plenum of the given level with air flowing in the at least one air plenum of the other level at a location that is downstream from the one or more heat-producing components mounted on the given level of the chassis and upstream from at least a portion of the plurality of heat-producing components mounted on the other level of the chassis.

6. The apparatus of claim 5, wherein the horizontal divider is configured such that a cross-sectional area of the other level, perpendicular to the other level air flow, downstream from one or more of the plurality of heat-producing components increases in cross-sectional area in the direction of the other level air flow.

7. The apparatus of claim 5, wherein the one or more heat-producing components mounted on the given level are one or more storage device controllers and the plurality of heat-producing components mounted on the other level are a plurality of storage devices, wherein the apparatus further comprises one or more data cables configured to connect the one or more storage device controllers to the plurality of storage devices, wherein the one or more cables are routed through at least one of the one or more openings in the horizontal divider.

8. The apparatus of claim 7, wherein the horizontal divider further comprises one or more additional openings situated above respective ones of the plurality of storage devices of the other level, wherein the one or more additional openings in the horizontal divider are configured to direct a portion of the given level air flow from the given level to the other level such that the air flow cools the respective ones of the plurality of storage devices.

9. The apparatus of claim 7, wherein the plurality of storage devices of the other level are mounted on a tray configured to at least partially slide out of the chassis interior, wherein respective ones of the plurality of storage devices are configured for hot-plug serviceability while the tray is at least partially slid out of the chassis interior.

10. The apparatus of claim 5, wherein the one or more openings are located in the horizontal divider downstream of a given plurality of the heat-producing components mounted on the other level, so that the given level air flow flowing in the at least one air plenum of the given level bypasses the given plurality of heat-producing components before mixing with the air flowing in the at least one air plenum of the other level.

11. The apparatus of claim 5, wherein the horizontal divider further comprises a vertical barrier at an end of the horizontal divider closest to the exhaust end of the chassis, wherein the vertical barrier at least partially inhibits air flowing in the at least one air plenum of the given level from flowing out the exhaust end of the given level without passing to the other level.

12. The apparatus of claim 5, wherein the set of one or more openings comprises one or more adjustable openings configured to adjust a balance of air flow between the given level and the other level.

13. The apparatus of claim 5, further comprising one or more fans in the chassis interior configured to create a pressure differential between the intake end and the exhaust end to draw air into the given level and the other level through the intake end and to exhaust air out the exhaust end.

14. The apparatus of claim 5, further comprising:
- one or more power supply units, wherein the power supply units are located in a separate portion of the chassis interior from the given level and other level; and
- a divider configured to at least partially isolate the separate portion from the given level and the other level to at least partially isolate an airflow in the separate portion for cooling the one or more power supply units from the given airflow of the given level and the other airflow of the other level.

15. A method, comprising:
- providing a chassis comprising a horizontal divider extending from an intake end of the chassis through at least a portion of a chassis interior of the chassis that at least partially divides the chassis interior of the chassis into a given level and another level, wherein the intake end is configured to receive cooling air into the chassis interior and wherein an exhaust end of the chassis is configured to exhaust air from the chassis interior;
- receiving air into the given level via a set of one or more openings prior to one or more heat producing components mounted on the given level in an upstream portion of the chassis;
- directing, via the horizontal divider, the air received into the given level as a given level air flow in at least one air plenum of the given level, wherein the given level air flow cools the one or more heat-producing components mounted on the given level;
- receiving air into the other level via another set of one or more openings prior to a plurality of heat producing components mounted on the other level;

directing, by the horizontal divider, the air received into the other level as an other level air flow in at least one air plenum of the other level, wherein the other level air flow cools the plurality of heat-producing components mounted on the other level; and mixing air flowing in the given level air flow with air flowing in the other level air flow, via one or more openings in the horizontal divider downstream of the one or more heat-producing components mounted on the given level and upstream from at least a portion of the plurality of heat-producing components mounted on the other level, wherein the mixed air flows through at least a portion of the at least one air plenum of the other level to cool a portion of the plurality of heat-producing components mounted on the other level downstream of the one or more openings in the horizontal divider.

16. The method of claim 15, further comprising directing, by the horizontal divider, the given level air flow into the one or more openings, wherein the horizontal divider is configured such that a cross-sectional area of the given level, perpendicular to the given level air flow, downstream from the one or more heat-producing components reduces in cross-sectional area in the direction of the given level air flow towards the exhaust end.

17. The method of claim 15, further comprising adjusting one or more adjustable openings of the set of one or more openings at the intake end of the chassis to change a balance of air flow between the given level and the other level.

18. The method of claim 15, further comprising routing one or more cables through the one or more openings in the horizontal divider to connect the one or more heat-producing components mounted on the given level with respective ones of the plurality of heat-producing components mounted on the other level.

19. The method of claim 18, further comprising directing the given level air flow into one or more additional openings in the horizontal divider, wherein the one or more additional openings are situated above respective ones of the heat-producing components mounted on the other level.

20. The method of claim 15, further comprising, directing a portion of the air received at the intake end of the chassis in a separate portion of the chassis to cool one or more power supply units mounted in the chassis, wherein the separate portion is at least partially isolated from the at least one air plenum of the given level and the at least one air plenum of the other level.

* * * * *